United States Patent [19]

Landi

[11] Patent Number: 6,048,807
[45] Date of Patent: Apr. 11, 2000

[54] POLYBUTADIENE AND POLYISOPRENE BASED THERMOSETTING COMPOSITIONS AND METHOD OF MANUFACTURE

[75] Inventor: Vincent R. Landi, Danielson, Conn.

[73] Assignee: World Properties, Inc., Lincolnwood, Ill.

[21] Appl. No.: 09/132,869

[22] Filed: Aug. 12, 1998

[51] Int. Cl.$^7$ ..................................................... D03D 3/00
[52] U.S. Cl. ........................ 442/237; 442/173; 442/180; 442/233; 442/234; 524/571
[58] Field of Search ..................... 442/173, 180, 442/233, 234, 237; 524/571

[56] References Cited

U.S. PATENT DOCUMENTS

| | | |
|---|---|---|
| 3,642,687 | 2/1972 | Naarmann et al. . |
| 3,644,584 | 2/1972 | Fryd . |
| 3,860,672 | 1/1975 | Lagally . |
| 3,919,133 | 11/1975 | Dawans et al. . |
| 3,940,534 | 2/1976 | Fick et al. . |
| 4,017,436 | 4/1977 | Tabana et al. . |
| 4,197,377 | 4/1980 | Bohm et al. . |
| 4,229,550 | 10/1980 | Jones et al. . |
| 4,241,132 | 12/1980 | Pratt et al. . |
| 4,268,433 | 5/1981 | Sawatari et al. . |
| 4,370,448 | 1/1983 | Leland . |
| 4,384,066 | 5/1983 | O'Shea . |
| 4,499,240 | 2/1985 | Valentine . |
| 4,554,470 | 11/1985 | Jerson et al. . |
| 4,587,300 | 5/1986 | Valentine . |
| 4,600,745 | 7/1986 | Creighton . |
| 4,704,318 | 11/1987 | Saito et al. . |
| 4,789,708 | 12/1988 | Guzy . |
| 4,820,764 | 4/1989 | Guzy et al. . |
| 4,997,702 | 3/1991 | Gazit et al. . |
| 5,223,568 | 6/1993 | Landi et al. ............................. 524/571 |
| 5,264,065 | 11/1993 | Kohm . |
| 5,571,609 | 11/1996 | St. Lawrence et al. ................. 428/268 |
| 5,858,887 | 1/1999 | St. Lawrence et al. ................. 442/237 |

FOREIGN PATENT DOCUMENTS

| | | |
|---|---|---|
| 0 202 488 | 11/1986 | European Pat. Off. . |
| 0 220 160 | 4/1987 | European Pat. Off. . |
| 0 234 450 | 9/1987 | European Pat. Off. . |
| 0 389 076 | 9/1990 | European Pat. Off. . |
| 0 430 092 A3 | 6/1991 | European Pat. Off. . |
| 0 460 539 A2 | 12/1991 | European Pat. Off. . |
| 0707038A1 | 9/1995 | European Pat. Off. . |
| 2539412 | 9/1975 | Germany . |
| 26 48 595 | 5/1977 | Germany . |
| 4-258658 | 9/1992 | Japan . |
| 050162238 | 6/1993 | Japan . |
| 050309651 | 11/1993 | Japan . |
| 1195567 | 6/1970 | United Kingdom . |
| 2172892 | 10/1986 | United Kingdom . |

OTHER PUBLICATIONS

"High Vinyl 1–2 Liquid Polybutadiene–Ricon Molding Compounds CCS–110" Feb. 1, 1980 Colorado Chemical Spec.

Colorado Chemical Brochure—"Ricon Product Bulletin", Aug. 20, 1985 High Vinyl 1–2 Liquid Polybutadiene.

Colorado Chemical Brochure—"Ricon Radome" High Vinyl 1–02 Liquid Polybutadiene, Feb. 1980.

N. Sawatari, I. Watanabe, H. Okuyama and K. Murakawa, "A New Flame Retardant, 1,2–Polybutadiene Laminate", 1983 pp. 131–137.

Ronald E. Drake, "1,2–Polybutadienes—High Performance Resins For The Electrical Industry", pp. 730–733 (1984).

Bruzzone et al., LaChimica E. L'Industria 47 (12) 1298–1302 (1965) "High Temperature Thermal Cross–linking of Cistatic Polybutadiene".

McCreedy et al., Polymer 20(4)(1979) "Effect of Thermal Crosslinking on Decomposition of Polybutadiene".

Takeuchi et al., "A New Thermoplastic Syndiotatic 1,2–polybutadiene," in New Industrial Polymers, ACS #4, pp. 15–25. Apr. 1974.

Barth et al., Modern Plastics pp. 142–148, (Nov. 1970) "fast—Curing Polybutadiene Thermosetting Resins".

*Primary Examiner*—Helen L. Pezzuto
*Attorney, Agent, or Firm*—Cantor Colburn LLP

[57] ABSTRACT

An electrical substrate material is presented comprising a thermosetting matrix which includes a polybutadiene or polyisoprene resin, an unsaturated butadiene- or isoprene-containing polymer and an ethylene propylene rubber; a particulate filler and, a fabric. Preferred ethylene propylene rubbers are ethylene propylene copolymers and ethylene propylene diene terpolymer rubbers wherein the diene is dicyclopentadiene. The ethylene propylene rubber is present in an amount of up to about 20 wt % with respect to the resin, preferably in an amount of about 1 to about 7 wt %, more preferably about 5 wt %. The presence of the ethylene propylene rubber enhances the dielectric strength of the resulting electrical substrate material, while other electrical, chemical, and mechanical properties of the material are not adversely effected.

23 Claims, 1 Drawing Sheet

POLYBUTADIENE AND POLYISOPRENE BASED THERMOSETTING COMPOSITIONS AND METHOD OF MANUFACTURE

BACKGROUND OF THE INVENTION

1. Field of the Invention

This invention relates generally to the field of circuit boards. In particular, this invention relates to substrates for circuit boards comprising a polybutadiene/polyisoprene thermosetting composition and an ethylene propylene rubber.

2. Brief Description of the Related Art

Circuit boards generally comprise an electrical substrate material laminated to a metal layer, usually copper. Electrical substrate materials used in circuit boards are most commonly composites, comprising a polymeric matrix and an inorganic filler. A variety of polymeric matrices have been used in these composites substrate materials, for example, thermoset resins together with inorganic particulate and/or fiber filler. Polybutadiene and polyisoprene resins and combinations thereof are particularly useful thermosetting compositions as described in commonly assigned U.S. Pat. No. 5,223,568 to Landi et al. and U.S. Pat. No. 5,571,609 to St. Lawrence et al., both of which are herein incorporated by reference in their entirety.

U.S. Pat. No. 5,571,609 discloses a thermosetting resin comprising a polybutadiene or polyisoprene resin and an unsaturated butadiene- or isoprene-containing polymer in an amount of 25 to 50 percent (vol %); a woven glass fabric in an amount of 10 to 40 vol %; and a particulate filler in an amount of 5 to 60 vol %. This filled composite material leads to a prepreg which has very little tackiness and can therefore be easily handled by operators. The material in accordance with this patent has a low dissipation factor, a consistent, low dielectric constant, and a low coefficient of thermal expansion, and is therefor ideal for wireless communication and high speed, high frequency signal transmission applications.

Other polymeric matrices and substrates commonly used for circuit boards are disclosed in U.S. Pat. No. 5,264,065 to Kohm, which describes a base material for printed wiring boards where inert filler is used to control Z axis coefficient of thermal expansion in fiberglass reinforced thermoset resins. The Kohm patent discloses a range of 45–65 weight percent (wt %) fiberglass reinforcement and a range of 30 to 100 parts filler per 100 parts of the polymer. U.S. Pat. No. 4,997,702 to Grant et al. discloses a circuit laminate having an epoxy resin system which also includes inorganic fillers or fibers in the range of 20–70 wt % of the total composite. The fibers include both glass and polymeric fibers and the fillers include clay or mineral (e.g., silica) particulate fillers. U.S. Pat. No. 4,241,132 to Pratt et al. discloses an insulating board comprising a polymeric matrix such as polybutadiene and a filler consisting of polymeric filler (e.g., fibrous polypropylene). In all cases, the dielectric constant or dissipation factor of the resin matrix is matched to the fibrous reinforcement in order to obtain an isotropic composite.

European Patent No. 0 202 488 A2 discloses a polybutadiene based laminate wherein a high molecular weight, bromine-containing prepolymer is used to reduce tack and flammability of a 1,2 polybutadiene resin. Similarly in Japanese Patent No. 04,258,658, a high molecular weight compound is added to a tacky polybutadiene resin to control tack. The compound utilized is a halogen-containing bismaleimide which provides flammability resistance as well as good copper bonding and heat resistance. There is no mention of the use of fillers and the resulting laminate has a relatively high dissipation factor.

The article entitled "1,2 Polybutadiene-High Performance Resins for the Electrical Industry", by R. E. Drake, ANTEC '84 pp. 730–733 (1984), generally discloses conventional polybutadiene resins for use in laminates and specifically discloses the use of reactive monomers which react with the polybutadiene. U.K. Patent Application 2 172 892A, generally discloses laminates composed of styrene-containing and thermoplastic copolymers with unsaturated double bonds and polybutadiene.

While the above composites are well-suited for their intended purposes, the industry constantly strives for circuit boards having improved dielectric strength, i.e., the resistance of a dielectric, an insulator, to electrical breakdown under the influence of strong electric fields. Such circuit boards have better reliability under extreme conditions.

Prior art attempts to improve dielectric strength focussed on lowering the degree of cure of the resin since it was thought that resin shrinkage was associated with reduced dielectric strength. However, such lower degree of cure, while it increased dielectric strength, also led to the undesirable effect of increased solvent absorption, increased warpage of the panels, and increased dissipation factor. Consequently, there is a perceived need in the art for improving the dielectric strength while maintaining optimal electrical, chemical, and thermal properties, as well as low cost.

SUMMARY OF THE INVENTION

The above-discussed and other drawbacks and deficiencies of the prior art are overcome or alleviated by the electrical substrate material of the present invention. The electrical substrate material of the present invention comprises: about 10 vol % to about 75 vol % thermosetting composition comprising a polybutadiene or polyisoprene resin and an unsaturated butadiene- or isoprene-containing polymer capable of participating in cross-linking with the polybutadiene or polyisoprene resin; up to about 14 vol % ethylene propylene containing rubber; up to about 50 vol % fabric; and up to about 65 vol % particulate filler.

These and other features, aspects, and advantages of the present invention will become better understood with reference to the following detailed description, drawings, and appended claims.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
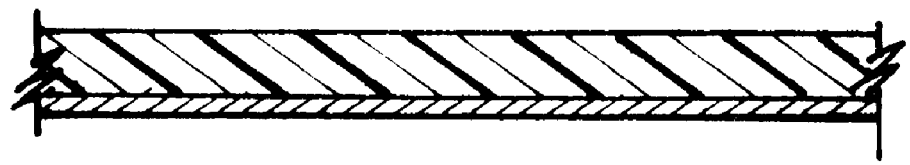
FIG. 1 is a cross-sectional elevation view of a circuit substrate material in accordance with the present invention.

The present invention comprises a woven or non-woven fabric, at least one type of particulate filler, and a thermosetting composition comprising an ethylene propylene rubber and optionally an unsaturated butadiene- or isoprene-containing polymer. The resin system, fillers, cross-linking agents, fabric, and representative constructions together with Examples is discussed in detail below. In general, the thermosetting compositions are processed as described in U.S. Pat. No. 5,571,609 to St. Lawrence et al.

Resin System

The resin system used in the electrical substrate material of this invention is an ethylene propylene rubber (ethylene propylene copolymer (EPM) or ethylene propylene diene terpolymer (EPDM)) and a thermosetting composition generally comprising: (1) a polybutadiene or polyisoprene resin or mixture thereof; and optionally (2) an unsaturated butadiene- or isoprene-containing polymer capable of participating in crosslinking with the polybutadiene or polyisoprene resin during cure.

The polybutadiene or polyisoprene resins crosslinks during cure and may be liquid or solid at room temperature, with liquid preferred in order to maintain the viscosity of the composition at a manageable level during processing. Liquid resins may have a number average molecular weight greater than 5,000 but preferably have a molecular weight of less than 5,000 (most preferably between 1,000 and 3,000). Polybutadiene and polyisoprene resins having at least 90 wt % 1,2-addition are preferred because they exhibit the greatest crosslink density upon cure due to the large number of pendent vinyl groups available for crosslinking. High crosslink densities are desirable because such electrical circuit substrates exhibit superior high temperature properties. Possible resins include B3000 resin, a low molecular weight polybutadiene liquid resin having greater than 90 wt % 1,2 addition and B1000 a lower molecular weight polybutadiene liquid resin having greater than 90 wt % 1,2-addition, commercially available from Nippon Soda, Ltd., Japan; RICON liquid 1,2-polybutadienes from Ricon, Grand Junction, Colo. among others.

In order to improve the dielectric strength of the resulting electrical substrate material, a lower molecular weight ethylene propylene rubber is added to the polybutadiene or polyisoprene. An "ethylene propylene rubber" as used herein is a copolymer, terpolymer, or other polymer comprising primarily ethylene and propylene. Ethylene propylene rubbers may be further classified as "EPM" copolymers (i.e., copolymers of ethylene and propylene monomers), or "EPDM" terpolymers (i.e., terpolymers of ethylene, propylene, and diene monomers). Ethylene propylene diene terpolymer rubbers, in particular, have saturated main chains, with unsaturation available off the main chain for facile cross-linking. Liquid ethylene propylene diene terpolymer rubbers in which the diene is dicyclopentadiene are preferred. Suitable ethylene propolymer rubbers include: Uniroyal Trilene CP80, a ethylene propylene rubber; Uniroyal Trilene 54, a liquid ethylene propylene diene terpolymer rubbers in which the diene is dicyclopentadiene; and Uniroyal Trilene 67, liquid ethylene propylene diene terpolymer and Uniroyal Trilene 77 (a liquid at high temperature) ethylene propylene diene terpolymer in which the diene is ethylidene norbornene, among others.

Typically, the preferred molecular weights of the ethylene propylene rubbers are less than 50,000 polystyrene equivalent weight average molecular weight by gel permeation chromatography (GPC). The ethylene propylene rubber is preferably present in an amount sufficient to improve the dielectric strength and potentially the physical and mechanical properties of the laminate with an amount of up to about 20 wt % with respect to the thermosetting polymer composition possible, in an amount of up to about 10 wt % preferred, with about 2 wt % to about 7 wt % especially preferred. With respect to the laminate composition (thermosetting composition, filler and fabric), the ethylene propylene rubber can be present in an amount of up to about 14 vol %, with up to about 7 vol % preferred, and about 0.2 vol % to about 5 vol % especially preferred.

Finally, a block polymer, also known as an unsaturated butadiene-or polyisoprene-containing polymer can optionally be utilized in order to adjust viscosity and improve physical and mechanical characteristics of the laminate. Preferably this polymer is a thermoplastic elastomer with a linear- or graft-type block copolymer comprising a polybutadiene or isoprene block and a thermoplastic block especially preferred. The polybutadiene or polyisoprene block can be any butadiene/isoprene containing copolymer, while the thermoplastic block is preferably styrene or α-methyl styrene. In a preferred embodiment, the unsaturated polymer comprises a block copolymer having the formula $X_m(Y-X)_n$ (linear copolymer) or the formula

(graft copolymer) where Y is a polybutadiene or polyisoprene block, X is a thermoplastic block, and m and n represent the average block numbers in said copolymer, m being 0 or 1 and n being at least 1.

Within the scope of the present invention, the thermoplastic elastomer may further comprise a second block similar to the polybutadiene or polyisoprene block. The second block can be a hydrogenated polybutadiene or polyisoprene block, forming a polyethylene block (in the case of polybutadiene) or an ethylene-propylene copolymer (in the case of polyisoprene). The composition optionally including a second block copolymer may have the formula $W_p(Z-W)_q$ (linear copolymer) or the formula

(graft copolymer) where Z is polyethylene or ethylene-propylene copolymer block, W is a thermoplastic block, and p and q represent the average block numbers in said copolymer, p being 0 or 1 and q being at least 1.

Possible block copolymers, e.g., styrene-butadiene-styrene tri-block copolymers, include Kraton DX1300 (commercially available from Shell Chemical Corporation, Houston, Tex.), and Vector 8508M (commercially available from Dexco Polymers, Houston, Tex.). Preferably, the copolymer is a styrene-butadiene di-block copolymer, such as Kraton D1118X (commercially available from Shell Chemical Corporation, Sol-T-6302 (commercially available from Enichem Elastomers America, Houston, Tex.), and Finaprene 401 (commercially available from Fina Oil and Chemical Company, Dallas, Tex.). Kraton D1118X is a di-block styrene-butadiene copolymer, containing 30 vol % styrene.

The volume:volume ratio of the polybutadiene or polyisoprene resin to the thermoplastic elastomer preferably is between 1:9 and 9:1, inclusive. The amount of combined polybutadiene or polyisoprene resin and unsaturated butadiene or isoprene-containing component is in the range of from about 10 to about 75 vol % of the total electrical substrate material, with about 10 vol % to about 50 vol % preferred.

Other free radical curable polymers which can co-cure with butadiene polymers may be added for specific property or processing modifications. Such possible modification purposes include toughness, adherability to copper foil and copper plating, and prepreg handling characteristics. These co-curable polymers include random and block copolymers of primarily 1,3-addition butadiene or isoprene with styrene, alpha-methyl styrene, acrylate or methacrylate, or acrylonitrile monomers; homopolymers or copolymers of ethylene, such as polyethylene, ethylene-propylene copolymer and ethylene-propylene diene-copolymers, ethylene-ethylene oxide copolymers; natural rubber; norbornene polymers such as polydicyclopentadiene; hydrogenated styrene-isoprene-styrene copolymers and butadiene-acrylonitrile copolymers; and others. Levels of these copolymers should be less than 50 vol % of the total polymeric component.

Particulate Filler

As will be discussed hereinafter, the material described herein is preferably used as a dielectric substrate in a circuit laminate wherein a layer of metal is laminated thereto. Preferably, the filler material and quantity thereof is selected so as to provide the substrate with a coefficient of thermal expansion which is equal or substantially equal to the coefficient of thermal expansion of the metal layer.

Examples of preferred fillers include titanium dioxide (rutile and anatase), barium titanate, strontium titanate, silica (particles and hollow spheres) including fused amorphous silica, corundum, wollastonite, aramide fibers (e.g., Kevlar), fiberglass, $Ba_2Ti_9O_{20}$, glass spheres, quartz, boron nitride, aluminum nitride, silicon carbide, beryllia, alumina or magnesia, used alone or in combination. Particularly preferred fillers are rutile titanium dioxide and amorphous silica because these fillers have a high and low dielectric constant, respectively, thereby permitting a broad range of dielectric constants combined with a low dissipation factor achievable in the final cured product by adjusting the respective amounts of the two fillers in the composition. To improve adhesion between the fillers and resin, coupling agents, e.g., silanes, are preferably used.

The volume percent of the filler (based upon the combined volume of the thermosetting composition fabric and particulate filler) can be up to about 65%, with 0 to about 60% preferred, and about 30% to about 50% especially preferred. It is preferred that the particulate filler is present in an amount which is (1) greater than the amount (in volume percent) of thermosetting composition (preferably the ratio of filler to thermosetting composition is 45:55) and (2) greater than the amount (in volume percent) of the fabric.

Fabric

The fabric comprises woven or non-woven, thermally stable webs or mats of a suitable fiber, preferably glass (E, S, and D glass) or high temperature polyester fibers (e.g., KODEL from Eastman Kodak). The fabric is present in an amount of up to about 50 vol %, with about 10 to 40 vol % preferred, and about 15 to about 25 vol % especially preferred (with respect to the entire laminate). Such thermally stable fabric provides the laminate a means of controlling shrinkage upon cure within the plane of the laminate. In addition, the use of the fabric produces a dielectric substrate with a relatively high mechanical strength.

Examples of the preferred fabrics, woven fiberglass fabric, are set forth in Table 1, nonwoven fabric are set forth in Table 2.

TABLE 1

| Manufacturer | Style | Thickness (inches) |
| --- | --- | --- |
| Fiber Glast | 519-A | 0.0015 |
| Clark-Schwebel | 112 | 0.0032 |
| Clark-Schwebel | 1080 | 0.0025 |
| Burlington | 106 | 0.0015 |
| Burlington | 7628 | 0.0068 |
| Clark-Scwebel | 1675 | 0.0040 |

TABLE 2

| Manufacturer | Name | Material | Style | Thickness (in.) |
| --- | --- | --- | --- | --- |
| Kuraray | Vectrus ® | Thermotropic liquid crystal polymer | HC-50 | 0.002 (0.05 mm) |
| Dupont | Thermount ® | Aramid fiber | E-210 | 0.002 (0.05 mm) |
| Vilene | Cumulass | E-Glass | EPM-4050 | 0.009 (0.24 mm) |
| Freudenberg | Surfacing Veils | E-Glass | T1775 | 0.012 (0.30 mm) |

Figure 2:
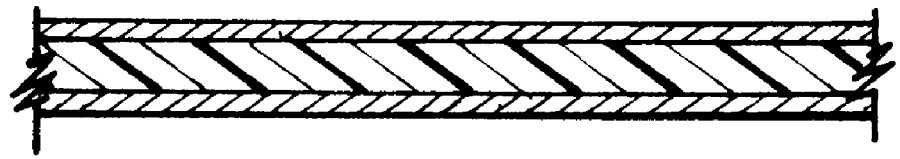
FIG. 2 is a cross-sectional elevation view of a circuit substrate material in accordance with the present invention.

Referring now to FIGS. 1 and 2, wherein like elements are number alike, preferred embodiments of the present invention are shown. FIG. 1 illustrates a single clad dielectric material 10 having a thermosetting composition in accordance with the present invention 12 and a single layer of copper 14 adhered by means known in the art to the composite 12. Such adhesion is by lamination, use of an adhesive, and the like.

FIG. 2 illustrates a diclad electrical material 20, wherein the thermosetting composition in accordance with the present invention 12 is adhered to two layers of a metal, e.g., copper 22, 24.

The following non-limiting examples further describe the electrical substrate material of the present invention.

EXAMPLES

The following examples were performed using 1675 woven glass fabric which was saturated with the various compositions described below in the fashion set forth in U.S. Pat. No. 5,571,609. These examples were performed in order to determine the effect of substituting a portion of the polybutadiene/polyisoprene resin or the triblock polymer with an ethylene propylene rubber and/or replacing all or a portion of the triblock polymer with a diblock polymer.

Samples 1–9, which were laminated at 500 psi for 3 hours at about 302° C. (575° F.) with a ramp-up of 85 minutes and a ramp-down to about 50° C. (120° F.) for 250 minutes, comprised a mixture of 11.2 wt % polybutadiene resin (B3000 Nippon Soda Ltd., 1,2 polybutadiene liquid resin), 12.42 wt % Vector 8508M (a tri-block (styrene-butadiene-styrene copolymer)), 1.22 wt % rubber, 52.84 wt % amorphous silica (CE 44I silica available from CE Minerals, sured using American Society for Testing Materials procedure ASTM D149. Xylene absorption was determined by soaking the laminate in xylene for 48 hours.

The prepreg quality for all of the samples was good, except for sample 9 where the material failed to disperse in the xylene. The remainder of the results are set forth in Table 3.

TABLE 3

| Property | Control A | 1 | 2 | 3 | 4 | 5 | 6 | 7 | 8 |
|---|---|---|---|---|---|---|---|---|---|
| Viscosity (cps) | 3325 (23° C.) | 4775 (20° C.) | 7200 (19° C.) | 14300 (19° C.) | 9050 (23° C.) | 4900 (22° C.) | 2875 (22° C.) | 14100 (19° C.) | 4075 (19° C.) |
| Prepreg Thickness (mils) | 13 | 11 | 13 | 10.5 | 9.5 | 11 | 8.5 | 10.5 | 10.5 |
| Laminate Thicknesses (mils) | 32 | 32 | 31 | 32 | 29 | 31 | 28 | 33 | 30 |
| Xylene Absorption after 48 hours (%) | 2.67 | 2.68 | 2.54 | 2.73 | 2.41 | 2.62 | 2.44 | 2.87 | 2.71 |
| Dielectric Strength (V/mil) | 533 | 689 | 671 | 603 | 695 | 494 | 461 | 212 | 318 |
| Peel Strength (pli) | 6.1 | 6.0 | 6.0 | 6.0 | 6.0 | 6.0 | 6.3 | 5.8 | 5.4 |

Greenville, Tenn.), 21.11 wt % 10 micron amorphous silica, 1.21 wt % methacrylate silane (A174, available from OSI Specialties, Tarrytown, N.Y.), with the control comprising 24.84 wt % polybutadiene resin and no rubber. The rubbers employed included: Sample 1, Trilene 67 (ethylene propylene diene terpolymer with ethylidene norbornene termonomer); Sample 2, Trilene 77 (ethylene propylene diene terpolymer with ethylidene norbornene termonomer and having some ethylene crystallinity); Sample 3, Trilene CP80 (liquid ethylene propylene copolymer without a termonomer); Sample 4, Trilene 54 (liquid ethylene propylene diene terpolymer with dicyclopentadiene termonomer); Sample 5, Royalene 505 (high molecular weight ethylidene norbornene termonomer solid type ethylene propylene diene terpolymer); Sample 6, Atochem R45HT (liquid 1,4 polybutadiene rubber, commercially available from Elf Atochem, France); Sample 7, Shell L 1203 (ethylene/butylene liquid elastomer with a hydroxyl termination at one end); Sample 8, Shell HPVM-2203 (ethylene/butylene liquid elastomer with hydroxyl termination at both ends); and Sample 9, Polysar Butyl XL 10000 (high molecular weight butyl rubber provided as a latex of very small particle size cross-linked rubber dispersed in water), respectively. Xylene, in the amount of 64 milliliters per 100 grams of solids (ml/100 g) was additionally utilized as the solvent. Note, Control A contained the same formulation as Samples 1–9 with the exception of the rubber and B3000; it contained 12.42 wt % B3000 and no rubber.

After the various samples had been prepared, the samples were tested to determine viscosity in centipoise (cps), prepreg and laminate thickness in mils, prepreg quality, percent xylene absorption, dielectric strength in volts per mil (V/mil), and peel strength in pounds per linear inch (pli). The peel strength was determined using the Institute for Interconnecting and Packaging Electronic Circuits, IPC-TM-650 2.4.8 procedures. The dielectric strength was mea- As is evident from Table 3, a significant dielectric strength improvement was obtained with the replacement of about 10 wt % of the polybutadiene polymer by ethylene propylene liquid rubber in Samples 1–4. No improvement was found using the solid ethylene propylene diene terpolymer or the other liquid rubbers (Samples 5–8). Consequently, tests were performed wherein varying portions of the polybutadiene polymer were replaced with the ethylene propylene liquid rubber. These samples, Control B and Samples 10–13, which were laminated at 500 psi for 3 hours at about 300° C. (575° F.) with a ramp-up of 85 minutes and a ramp-down to about 50° C. (120° F.) for 250 minutes, contained 74.47 wt % amorphous silica (FB-35 from Denka, Japan), 1.19 wt % methacrylate silane (A174). Control B additionally contained 12.17 wt % B3000 and 12.17 wt % Vector 8508M, while Samples 10–13 further comprised: 10.95 wt % B3000, 12.17 wt % Vector 8508M, and 1.22 wt % Trilene CP54; 11.40 wt % B3000, 12.17 wt % Vector 8508M, and 0.73 wt % Trilene CP54; 11.90 wt % B3000, 12.17 wt % Vector 8508M, and 0.24 wt % Trilene CP54; and 12.17 wt % B3000, 10.95 wt % Vector 8508M and 1.22 wt % Trilene CP54, respectively. Xylene, in the amount of 64 ml/100 g was additionally utilized as a solvent. The results are set forth in Table 4.

TABLE 4

| Property | Control B | 10 | 11 | 12 | 13 |
|---|---|---|---|---|---|
| Viscosity (cps) | 3750 (23° C.) | 2650 (25° C.) | 2775 (23° C.) | 2625 (24° C.) | 3625 (23° C.) |
| Prepreg Thickness (mils) | 10 | 9 | 9 | 11 | 12 |
| Laminate Thicknesses (mils) | 34 | 33 | 30 | 32 | 38 |

TABLE 4-continued

| Property | Sample No. | | | | |
|---|---|---|---|---|---|
| | Control B | 10 | 11 | 12 | 13 |
| Xylene Absorption after 48 hours (%) | 3.45 | 2.95 | 2.85 | 3.01 | 1.93 |
| Dielectric Strength (V/mil) | 257 | 520 | 571 | 361 | 448 |
| Peel Strength (pli) | 6.0 | 5.6 | 5.6 | 6.2 | 5.6 |

Dielectric strength improvement was additionally attained via the use of a styrene-butadiene di-block copolymer versus a styrene-butadiene-styrene tri-block copolymer. These results are set forth in Table 6 where Samples 14–20, which were laminated at 500 psi for 3 hours at about 302° C. (575° F.) with a ramp-up of 85 minutes and a ramp-down to about 50° C. (120° F.) for 250 minutes, contained: 74.47 wt % amorphous silica (FB-35 silica), 1.19 wt % methacrylate silane (A174), and varying amounts of di-block and tri-block copolymers as set forth in Table 5. Xylene, in the amount of 50 ml/100 g was additionally used as a solvent.

TABLE 5

| Component | Sample Number | | | | | | | |
|---|---|---|---|---|---|---|---|---|
| | Control C | 14 | 15 | 16 | 17 | 18 | 19 | 20 |
| B3000 | 12.17 | 6.09 | 12.17 | 12.17 | 12.17 | 12.17 | 12.17 | 12.17 |
| B1000 | | 6.08 | | | | | | |
| Vector 8508M (tri-block) | 12.17 | | | 6.08 | 9.12 | 9.12 | 6.08 | 6.08 |
| Sol-T-6302 (30% styrene, 0.91 inherent viscosity; tri-block) | | | 12.17 | | | | | |
| Kraton D-1118X (di-block, 30% styrene, low viscosity) | | | 12.17 | 6.09 | 3.05 | | | |
| Sol-T-166 (styrene-isoprene-styrene, 14% styrene, low viscosity) | | | | | | | 6.09 | |
| Sol-T-190 (30% styrene, inherent viscosity; tri-block) | | | | | | | | 6.09 |
| Kraton D1107 (styrene-isoprene-styrene tri-block copolymer) | | | | | | 3.05 | | |

Note, Sol-T-6302, Sol-T-166 and Sol-T-190 are available from Enichem Elastomers Americas, Inc., Houston, Tex., while the Kraton D-1118X and Kraton D1107 are available from Shell Chemical Corporation.

TABLE 6

| Property | Sample No. | | | | | | | |
|---|---|---|---|---|---|---|---|---|
| | Control C | 14 | 15 | 16 | 17 | 18 | 19 | 20 |
| Viscosity (cps)* | 3825 | 1900 | 2850 | 3350 | 3800 | 4400 | 3950 | 3625 |
| Prepreg Thickness (mils) | 10 | 9 | 9 | 9.5 | 9.5 | 9.5 | 9 | 10 |
| Laminate Thicknesses (mils) | 33 | 29 | 31 | 31 | 32 | 32 | 31 | 29 |
| Xylene Absorption, after 48 hours (%) | 3.10 | 3.55 | 2.15 | 2.66 | 2.94 | 4.66 | 3.07 | 5.06 |
| Dielectric Strength (V/mil) | 257 | 328 | 523 | 490 | 165 | 319 | 307 | 468 |
| Peel Strength (pli) | 5.6 | 5.6 | 5.6 | 6.0 | 6.4 | 5.2 | 5.6 | 5.6 |

*Brookfield viscosity measured at room temperature (~23° C.).

As is shown in Table 7, Samples 14–20 described above were further tested wherein the lamination pressure was 1000 psi.

TABLE 7

| Property | Sample No. | | | | | | | |
|---|---|---|---|---|---|---|---|---|
|  | Control C | 14 | 15 | 16 | 17 | 18 | 19 | 20 |
| Viscosity (cps)* | 3825 | 1900 | 2850 | 3350 | 3800 | 4400 | 3950 | 3625 |
| Prepreg Thickness (mils) | 10 | 9 | 9 | 9.5 | 9.5 | 9.5 | 9 | 10 |
| Laminate Thicknesses (mils) | 33 | 30 | 30 | | | | | |
| Xylene Absorption, after 48 hours (%) | 3.74 | 3.10 | 3.21 | | Not Measured | | | |
| Dielectric Strength (V/mil) | 139 | 543 | 608 | 600 | 571 | 439 | 419 | 260 |
| Peel Strength (pli) | 5.8 | 5.6 | 5.6 | 6.0 | 6.0 | 5.6 | 6.0 | 5.6 |

*Brookfield viscosity measured at room temperature (~23° C.).

Under both lamination conditions, 500 psi and 1,000 psi, the prepreg qualities for Samples 14–20 were good.

As can be seen from Tables 6 and 7, under both lamination conditions, the dielectric strength for the di-block samples (Samples 15, 16, and 17) was better than that for the tri-block samples (Control C and Samples 14, 18, 19, and 20), with the di-block samples showing a marked improvement at elevated lamination pressures.

In order to optimize dielectric strength, it is further preferred, in addition to replacing a portion of the polybutadiene polymer with an ethylene propylene rubber, to replace at least a portion of the tri-block copolymer with a di-block copolymer, and is especially preferred to process the di-block containing composite at elevated pressures, exceeding 500 psi, with pressures exceeding 800 psi especially preferred. One example of a combined replacement comprised a laminate having: 11.2 wt % B3000, 12.42 wt % Kraton D118X, 1.22 wt % B3000, 52.84 wt % amorphous silica (CE 44I Silica), 21.11 wt % 10 micron amorphous silica, 1.21 wt % methacrylate silane (A174), with 64 ml/100 g xylene solvent used during preparation of the prepreg. The final laminate, which was laminated at 500 psi, had a laminate thickness of 30 mils, xylene absorption of 2.47%, dielectric strength of 933 V/mil, and a peel strength of 5.5 pli. In a repeated test with this composition a laminate having a dielectric strength of 1067 V/mil was obtained.

It should be noted that replacement of a portion of the tri-block copolymer with a ethylene propylene rubber also improved dielectric strength (See Table 4, Sample 13). Consequently, replacement of a portion of the tri-block polymer with ethylene propylene rubber and/or a di-block copolymer is contemplated herein. Up to 100% of the tri-block polymer can be replaced with a di-block copolymer or with the di-block copolymer and up to 20 wt % of that di-block replacement being ethylene propylene rubber.

Overall, the electrical circuit substrate material of the present invention comprises: up to about 20 vol % ethylene propylene rubber; up to about 50 vol % fabric; up to about 75 vol % filler and thermosetting compositions having about 10 vol % to about 75 vol % polybutadiene or polyisoprene resin and an unsaturated butadiene-or isoprene-polymer, with up to about 7 vol % ethylene propylene rubber; up to about 40 vol % fabric; up to about 60 vol % filler; and a thermosetting composition having about 10 vol % to about 50 vol % polybutadiene or polyisoprene resin and an unsaturated butadiene-or isoprene-polymer preferred; and about 0.2 vol % to about 5 vol % ethylene propylene rubber; about 15 vol % to about 25 vol % fabric; about 30 to about 50 vol % filler; and a thermosetting composition having about 20 vol % to about 30 vol % polybutadiene or polyisoprene resin and an unsaturated butadiene-or isoprene-polymer especially preferred.

The utilization of ethylene propylene diene rubber in the composite of the present invention significantly improved dielectric strength; 10 wt % replacement of the polybutadiene resin resulted in an approximately 67% dielectric strength improvement in thin glass constructions (2.5 mils thick per layer), and about 100% dielectric strength improvement in thick glass constructions (4.0 mils thick per layer), with a 10 wt % replacement of the tri-block copolymer resulting in an approximately 70% dielectric strength improvement, compared to a similar composition not utilizing the rubber. Further dielectric strength improvement was obtained via the replacement of at least a portion of the tri-block copolymer with a di-block copolymer, with a replacement of between about 50 volume % and 100 volume % preferred.

Through inclusion of an ethylene propylene rubber in the thermosetting matrix, the dielectric strength of the resulting electrical substrate material substantially improves, while other electrical, chemical, and mechanical properties of the material are not adversely effected. Additionally, the foregoing component ratios leads to a prepreg which has very little tackiness and can therefore be easily handled by operators. This low tackiness feature allows for the use of conventional automated layup processing, including foil cladding, using one or more known roll laminators. While the prepreg of this invention is tack-free enough to be tacked by itself using a roll laminator (e.g., nip roller) at room temperature.

While preferred embodiments have been shown and described, various modifications and substitutions may be made thereto without departing from the spirit and scope of the invention. Accordingly, it is understood that the present invention has been described by way of illustrations and not limitation.

What is claimed is:

1. An electrical circuit substrate material, comprising:
   (a) about 10 vol % to about 75 vol % thermosetting composition comprising a polybutadiene or polyisoprene resin;
   (b) up to about 14 vol % ethylene propylene containing rubber, wherein the ethylene propylene containing rubber is a liquid having a weight average molecular weight of less than 50,000 as measured by gel permeation chromatography;
   (c) up to about 50 vol % fabric; and
   (d) up to about 65 vol % particulate filler, wherein the amount of each of the thermosetting composition, ethylene propylene-containing rubber, fabric, and particulate filler is based on the total electrical substrate material.

2. The electrical circuit material of claim 1, further comprising: about 10 vol % to about 50 vol % of said thermosetting composition; and up to about 7 vol % of said ethylene propylene containing rubber, each based on the total electrical substrate material.

3. The electrical circuit material of claim 1, wherein said polybutadiene or polyisoprene resin has a number average molecular weight less than 5,000.

4. The electrical circuit material of claim 1, wherein said polybutadiene or polyisoprene resin includes pendent vinyl groups available for crosslinking.

5. The electrical circuit material of claim 1, further comprising up to about 7 vol % of said ethylene propylene containing rubber based on the total electrical substrate material.

6. The electrical circuit material of claim 1, further comprising about 0.2 vol % to about 5 vol % of said ethylene propylene containing rubber based on the total electrical substrate material.

7. The electrical circuit material of claim 1, wherein the thermosetting composition further comprises an unsaturated butadiene- or isoprene-containing polymer, and wherein at least a portion of said unsaturated butadiene- or isoprene-containing polymer is a di-block copolymer.

8. The electrical circuit material of claim 7, wherein said unsaturated butadiene- or isoprene-containing polymer is a styrene-butadiene di-block copolymer.

9. The electrical circuit material of claim 8, further comprising up to about 7 vol % of said ethylene propylene containing rubber based on the total electrical substrate material.

10. The electrical circuit material of claim 1, wherein the thermosetting composition further comprises an unsaturated butadiene- or isoprene-containing polymer, and wherein the unsaturated butadiene- or isoprene-containing polymer is a copolymer of isoprene or butadiene and a second monomer.

11. The electrical circuit material of claim 10, wherein the second monomer is styrene or alpha-methyl styrene.

12. The electrical circuit material of claim 1, wherein said ethylene propylene containing rubber is an ethylene propylene copolmyer, an ethylene propylene diene terpolymer, or a combination thereof.

13. The electrical circuit material of claim 12, wherein said diene is dicyclopentadiene or ethylidene norbornene.

14. The electrical circuit material of claim 1, further comprising up to about 60 vol % filler and up to about 40 vol % fabric based on the total electrical substrate material.

15. The electrical circuit material of claim 14, wherein said filler is titanium dioxide, barium titanate, strontium titanate, silica, fused amorphous silica, corundum, wollostonite, polytetrafluoroethylene, aramide fibers, fiberglass, $Ba_2Ti_9O_{20}$, glass spheres, quartz, boron nitride, aluminum nitride, silicon carbide, beryllia, alumina or magnesia.

16. The electrical circuit material of claim 1, wherein the electrical circuit material further comprises about 30 volume % to about 50 volume % filler based on the total electrical substrate material.

17. The electrical circuit material of claim 1, wherein the electrical circuit material further comprises about 15 vol % to about 25 vol % fabric based on the total electrical substrate material.

18. The electrical circuit material of claim 1, wherein the electrical circuit substrate material has a dielectric strength of equal to or greater than 500 V/mil.

19. The electrical circuit material of claim 1, wherein said thermosetting composition further comprises an unsaturated butadiene- or isoprene-containing polymer capable of participating in cross-linking with the polybutadiene or polyisoprene resin.

20. An electrical circuit substrate material, comprising:
   (a) about 10 vol % to about 50 vol % thermosetting composition comprising a polybutadiene or polyisoprene resin and an unsaturated butadiene- or isoprene-containing polymer capable of participating in cross-linking with the polybutadiene or polyisoprene resin;
   (b) up to about 7 vol % ethylene propylene containing rubber, wherein the ethylene propylene containing rubber is a liquid having a weight average molecular weight of less than 50,000 as measured by gel permeation chromatography;
   (c) up to about 40 vol % fabric; and
   (d) up to about 60 vol % particulate filler, wherein the amount of each of the thermosetting composition, ethylene propylene-containing rubber, fabric, and particulate filler is based on the total electrical substrate material.

21. The electrical circuit material of claim 20, wherein the electrical circuit substrate material has a dielectric strength of equal to or greater than 500 V/mil.

22. An electrical circuit substrate material, consisting essentially of:
   (a) about 10 vol % to about 50 vol % thermosetting composition comprising a polybutadiene or polyisoprene resin and an unsaturated butadiene- or isoprene-containing polymer capable of participating in cross-linking with the polybutadiene or polyisoprene resin;
   (b) up to about 7 vol % ethylene propylene containing rubber, wherein the ethylene propylene containing rubber is a liquid having a weight average molecular weight of less than 50,000 as measured by gel permeation chromatography;
   (c) up to about 40 vol % fabric; and
   (d) up to about 60 vol % particulate filler, wherein the amount of each of the thermosetting composition, ethylene propylene-containing rubber, fabric, and particulate filler is based on the total electrical substrate material.

23. The electrical circuit material of claim 22, wherein the electrical circuit substrate material has a dielectric strength of equal to or greater than 500 V/mil.

* * * * *

UNITED STATES PATENT AND TRADEMARK OFFICE
CERTIFICATE OF CORRECTION

PATENT NO. : 6,048,807
DATED : April 11, 2000
INVENTOR(S) : Vincent R. Landi

It is certified that error appears in the above-identified patent and that said Letters Patent is hereby corrected as shown below:

Column 2,
Line 24, after "strength" delete "focussed" and insert therefor -- focused --

Column 3,
Line 59, after "CP80," delete "a" and insert therefor -- an --
Line 61, after "terpolymer" delete "rubbers" and insert therefor -- rubber --

Column 6,
Line 26, Table 1, last row, delete "Clark-Scwebel" and insert therefor -- Clark-Schwebel --
Line 43, before "alike" delete "number" and insert therefor -- numbered --

Column 11,
Line 51, after "with" delete "a" and insert therefor -- an --

Signed and Sealed this

Twenty-eighth Day of June, 2005

JON W. DUDAS
*Director of the United States Patent and Trademark Office*